(12) United States Patent
Huang

(10) Patent No.: US 11,296,125 B2
(45) Date of Patent: Apr. 5, 2022

(54) ARRAY SUBSTRATE AND DISPLAY PANEL

(71) Applicant: HKC CORPORATION LIMITED, Guangdong (CN)

(72) Inventor: Beizhou Huang, Chongqing (CN)

(73) Assignee: HKC Corporation Limited, Shenzhen (CN)

( * ) Notice: Subject to any disclaimer, the term of this patent is extended or adjusted under 35 U.S.C. 154(b) by 204 days.

(21) Appl. No.: 16/758,158

(22) PCT Filed: Mar. 6, 2018

(86) PCT No.: PCT/CN2018/078119
§ 371 (c)(1),
(2) Date: Apr. 22, 2020

(87) PCT Pub. No.: WO2019/080433
PCT Pub. Date: May 2, 2019

(65) Prior Publication Data
US 2020/0343270 A1    Oct. 29, 2020

(30) Foreign Application Priority Data
Oct. 24, 2017 (CN) .......................... 201711003577.8

(51) Int. Cl.
*H01L 27/12* (2006.01)
*H01L 27/02* (2006.01)
*G02F 1/1362* (2006.01)
*H01L 21/66* (2006.01)

(52) U.S. Cl.
CPC ...... *H01L 27/124* (2013.01); *G02F 1/136204* (2013.01); *H01L 27/0292* (2013.01); *H01L 22/32* (2013.01); *H01L 27/0296* (2013.01)

(58) Field of Classification Search
CPC . H01L 27/0292–0296; H01L 22/30–32; H01L 23/60–62; H01L 27/124–1244; G09G 2330/04; G09G 2300/0426; G09G 3/006; G09G 2330/12; G02F 1/1345–13458; G02F 1/136204; G01N 2021/9513
See application file for complete search history.

(56) References Cited

FOREIGN PATENT DOCUMENTS

| CN | 104380367 A | 2/2015 |
|---|---|---|
| CN | 105954899 A | 9/2016 |
| CN | 105976785 A | 9/2016 |
| CN | 106057109 A | 10/2016 |
| CN | 107589612 A | 1/2018 |
| KR | 10-2011-0064783 A | 6/2011 |

*Primary Examiner* — Amar Movva
(74) *Attorney, Agent, or Firm* — Muncy, Geissler, Olds & Lowe, P.C.

(57) ABSTRACT

An array substrate, comprises: a plurality of test leads correspondingly connected to a plurality of signal lines respectively through an electrostatic protection circuit; a plurality of driving chip binding pads, which are correspondingly connected to the plurality of test leads respectively through driving signal leads, and are configured to input a driving signal sent from a driving chip to the plurality of signal lines through the plurality of test leads; and the electrostatic protection circuit, which comprises a first connection terminal electrically connected to the plurality of test leads, and a second connection terminal electrically connected to the plurality of signal lines.

18 Claims, 6 Drawing Sheets

ARRAY SUBSTRATE AND DISPLAY PANEL

BACKGROUND OF THE INVENTION

Field of Invention

This embodiment relates to a technical field of a display, and more particularly to an array substrate and a display panel.

Related Art

Electrostatic charges are positive or negative charges formed on a surface of an object due to the unbalance charges caused by some reason. When the charge transfer occurs, different potentials discharge mutually, and the electrostatic discharge (ESD) occurs.

When the electrostatic voltage is equal to 2,000 volts (V), the human body can not feel it, but electrostatic sensitive components, such as complementary metal-oxide semiconductor (CMOS) integrated circuit devices and so on, used by electronic products upon fabrication are damaged by the electrostatic voltage. Because the CMOS integrated circuit devices can only withstand the voltage ranging from 250 to 2,000 V, they are be damaged when the voltage is higher than 2,000 V. Electrostatic discharge can break through the integrated circuit chip medium, fuse the core wire, increase the leakage current, accelerate the aging, change the electrical performance parameters, and the like.

Therefore, the ESD protection is very important, and associated factors of the ESD protection include: the circuit design considerations, the reduction of the electrostatic charges, canalization or neutralization of generated electrostatic charges and electrostatic discharge.

The ESD protection circuit is added to the circuit of the display panel of the thin film transistor liquid crystal display (TFT-LCD), and the ESD protection circuit plays a protective effect to prevent the assembly inside the circuit of the display panel from being damaged by the ESD. When the ESD voltage is present on the pixel array, the ESD protection circuit fabricated near the pixel array must be able to turn on early to discharge the ESD discharge current. Therefore, the assembly used in the ESD protection circuit must have a lower breakdown voltage or higher turn-on speed.

In order to save the cost in the production process of products, after each procedure is completed, the products are detected one by one so that the failed products are screened out. After the process of the array substrate ends, a test is performed on the array substrate to avoid the color filter substrate from being wasted. After the process of the display panel is completed, a test is performed on the display panel to avoid the cost of the module from being wasted. After different procedures are completed, the panels will be detected, wherein different ways are used to provide the signal, so there will be different models of signal binding pads. Therefore, different models of ESD protection circuits are correspondingly developed, and a certain amount of space is required for different ESD protection circuits to prevent possible electrostatic damage from being caused by different tests.

SUMMARY OF THE INVENTION

This disclosure provides an array substrate and a display panel, which solve the problem that different models of electrostatic protection circuits of the display panel in the related art occupy a very large fan-out area and affect the space utilization.

The present embodiment provides an array substrate comprising a display area and a non-display area surrounding the display area. The array substrate further comprises: a plurality of signal lines disposed in the display area and the non-display area; at least one electrostatic protection circuit disposed in the non-display area; a plurality of test leads disposed in the non-display area and correspondingly connected to the plurality of signal lines respectively through the electrostatic protection circuit; and, a plurality of driving chip binding pads, which are disposed in the non-display area, correspondingly connected to the plurality of test leads respectively through driving signal leads, and are configured to input a driving signal sent from a driving chip to the plurality of signal lines through the plurality of test leads; wherein the electrostatic protection circuit comprises a first connection terminal electrically connected to the plurality of test leads, and a second connection terminal electrically connected to the plurality of signal lines, and the electrostatic protection circuit is configured to output an electrostatic current generated by the array substrate upon externally inputting a test signal and binding the drive chip.

The present embodiment further provides an array substrate comprising a display area and a non-display area surrounding the display area. The array substrate further comprises: a plurality of signal lines disposed in the display area and the non-display area; at least one electrostatic protection circuit disposed in the non-display area; a plurality of test leads disposed in the non-display area and correspondingly connected to the plurality of signal lines respectively through the electrostatic protection circuit; a plurality of driving chip binding pads, which are disposed in the non-display area, correspondingly connected to the plurality of test leads respectively through driving signal leads, and are configured to input a driving signal sent from a driving chip to the plurality of signal lines through the plurality of test leads; wherein the electrostatic protection circuit comprises a first connection terminal electrically connected to the plurality of test leads, and a second connection terminal electrically connected to the plurality of signal lines, and the electrostatic protection circuit is configured to output an electrostatic current generated by the array substrate upon externally inputting a test signal and binding the drive chip; in a first direction, at least two gate drivers are disposed in the non-display area which is on two sides of the display area; the signal lines comprise data signal lines which are disposed in the display area and drive signal lines of the gate drivers in the non-display area, the signal lines are disposed in a second direction and the second direction is perpendicular to the first direction, and a plurality of test pads, which are respectively corresponding to and electrically connected to the plurality of test leads.

The present embodiment further provides a display panel which comprises an opposing substrate and any one of the array substrates as disclosed above.

In this embodiment, the display panel shares at least one electrostatic protection circuit in the panel lighting test and the module lighting test, and it is not necessary to individually dispose the electrostatic protection circuit for the panel lighting test and the electrostatic protection circuit for the module lighting test in the fan-out area of the display panel. Hence, the fan-out area of the space is saved, and the manufacturing process is simplified.

DETAILED DESCRIPTION OF THE INVENTION

Figure 1A:
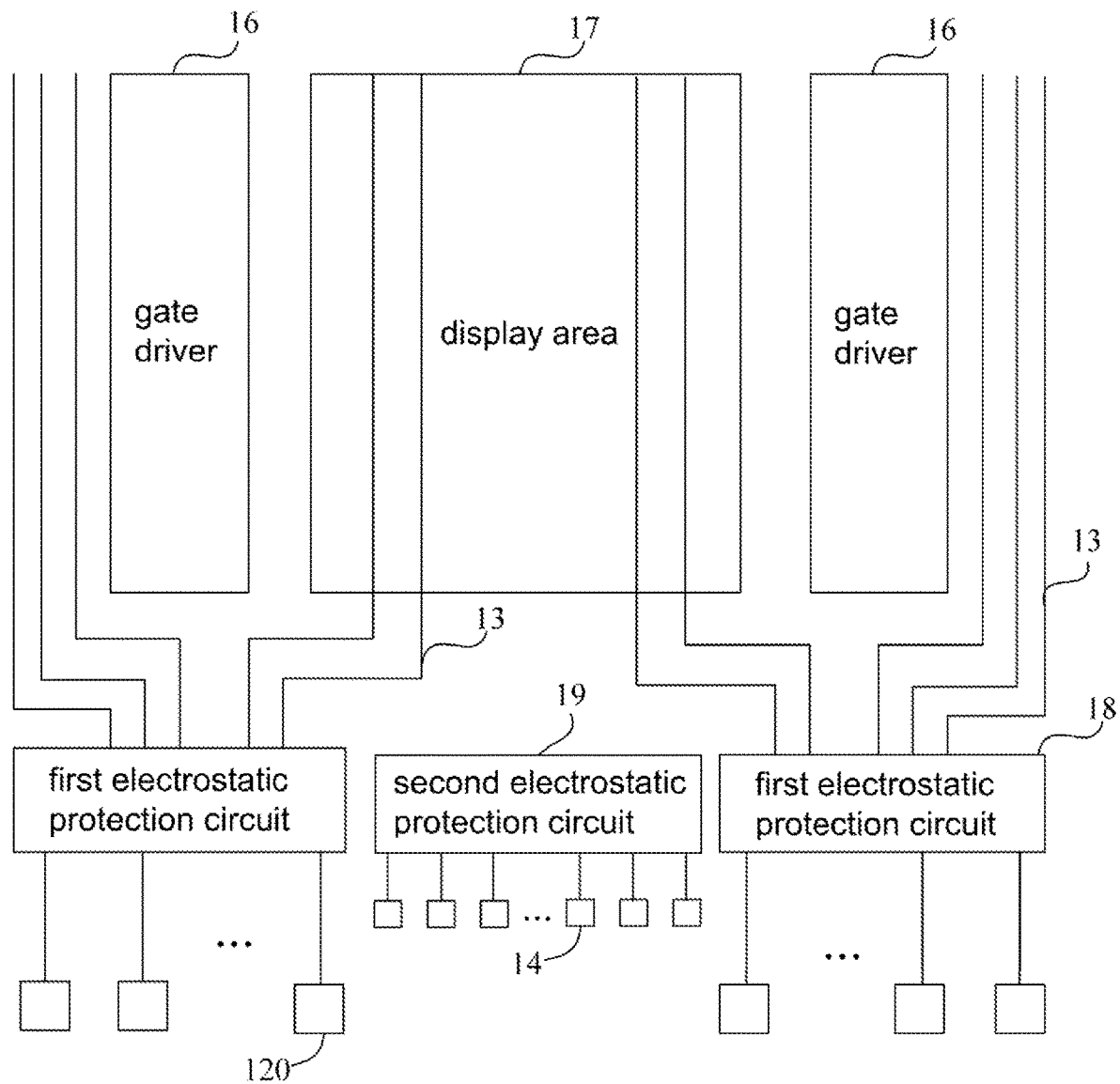
FIG. 1a is a schematic structure view showing an array substrate provided by the related art.

Referring to FIG. 1a, which is a schematic structure view showing an array substrate provided by the related art, in a production process of a display panel, when an array substrate and a color filter substrate are bound together form a display panel, a panel lighting test needs to be performed; and after a module process is finished, a module lighting test needs to be performed, wherein different stages of tests are performed by inputting external signals into binding pads, then the external signals are transmitted into the panel, and the operation of inputting the external signals often brings electrostatic charges, so different electrostatic protection circuits are designed according to different models of binding pads. In normal conditions, as the binding pad gets larger, the required model of the electrostatic protection circuit gets larger. Referring to FIG. 1a, the model of a test binding pad 120 for performing the panel lighting test is larger than that of a driving chip binding pad 14 for performing the module lighting test, so that first electrostatic protection circuits 18 are provided for outputting the high voltages introduced by the test pads 120. Optionally, the high voltages in this embodiment and the following embodiment may be in the range from 100 V to 15 KV. As shown in FIG. 1a, the first electrostatic protection circuits 18 are respectively electrically connected to signal lines 13 and the test pads 120 and for outputting the electrostatic charges generated by the array substrate during the panel lighting test.

Figure 1B:
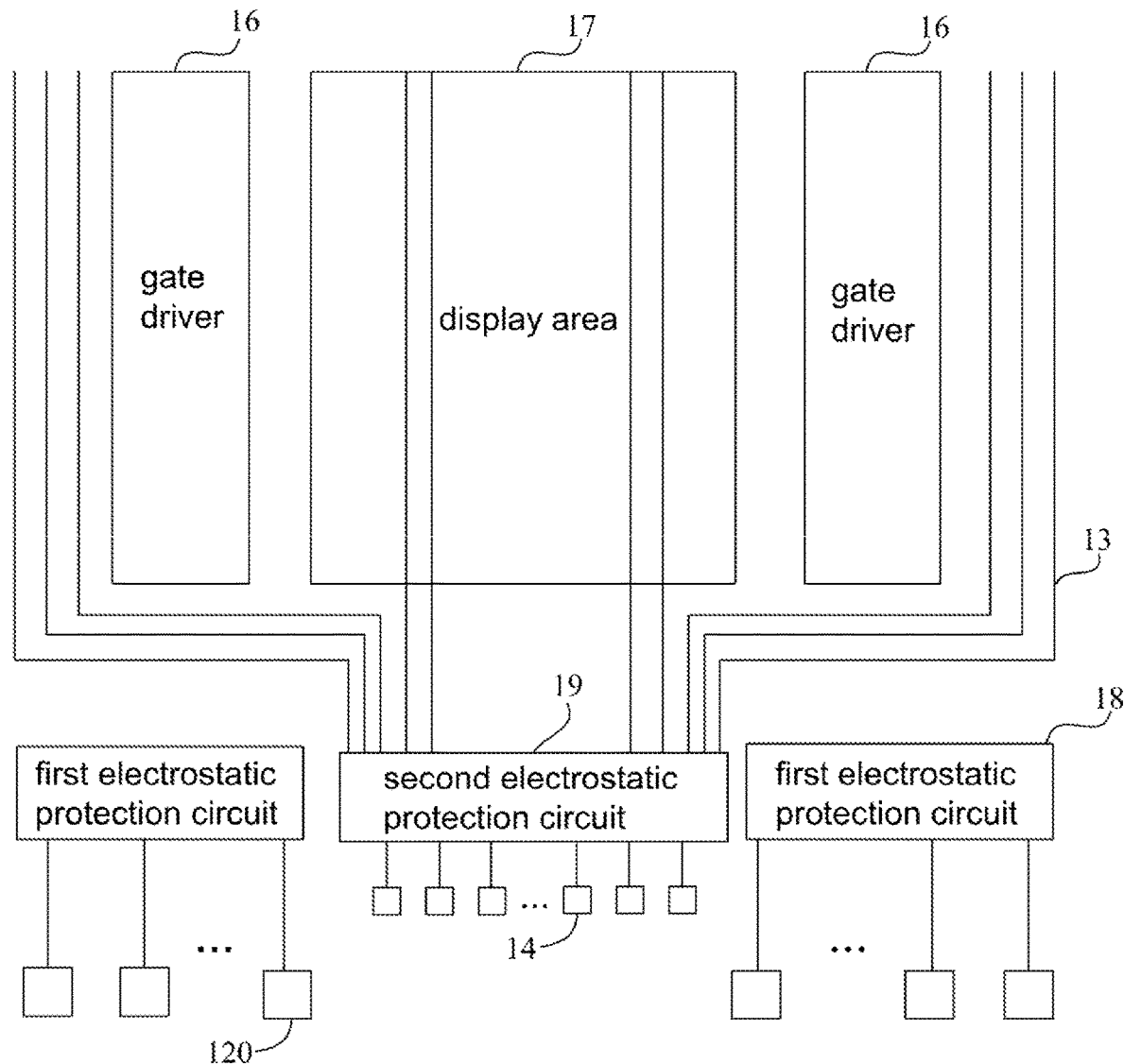
FIG. 1b is a schematic structure view showing another array substrate provided by the related art.

Referring to FIG. 1b, which is a schematic structure view showing another array substrate provided by the related art, in the module lighting test, the test signal is inputted from the drive chip (not shown in the drawing). As shown in FIG. 1b, the drive chip binding pad 14 is smaller, and only a smaller model of a second electrostatic protection circuit 19 is required to output and bind the high voltage introduced by the drive chip. The second electrostatic protection circuits 19 are respectively electrically connected to the signal lines 13 and the driving chip binding pads 14, and for outputting the electrostatic charges generated by the array substrate during the module lighting test.

Figure 1C:
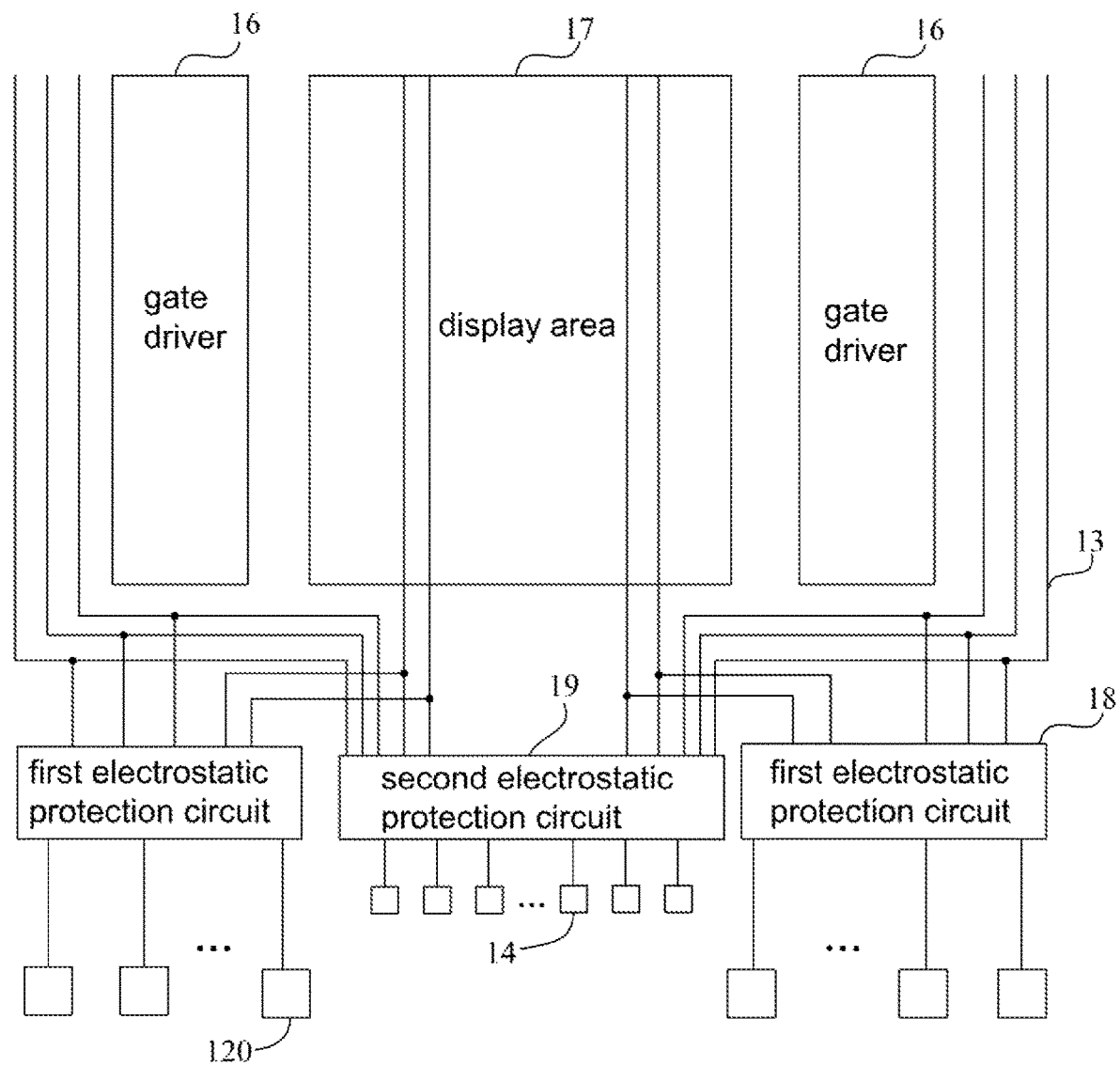
FIG. 1c is a schematic structure view showing another array substrate provided by the related art.

Exemplarily, the circuit connection relationship on the array substrate is as shown in FIG. 1c which is a schematic structure view showing another array substrate provided by the related art, and the first electrostatic protection circuits 18 and the second electrostatic protection circuits 19 are disposed on the display panel at the same time. The inventor of this disclosure found that the trace connection of the array substrate in the related art is complicated, that different tests require different models of electrostatic protection circuits, and that the different models of electrostatic protection circuits occupy a larger space of the fan-out area.

Figure 2:
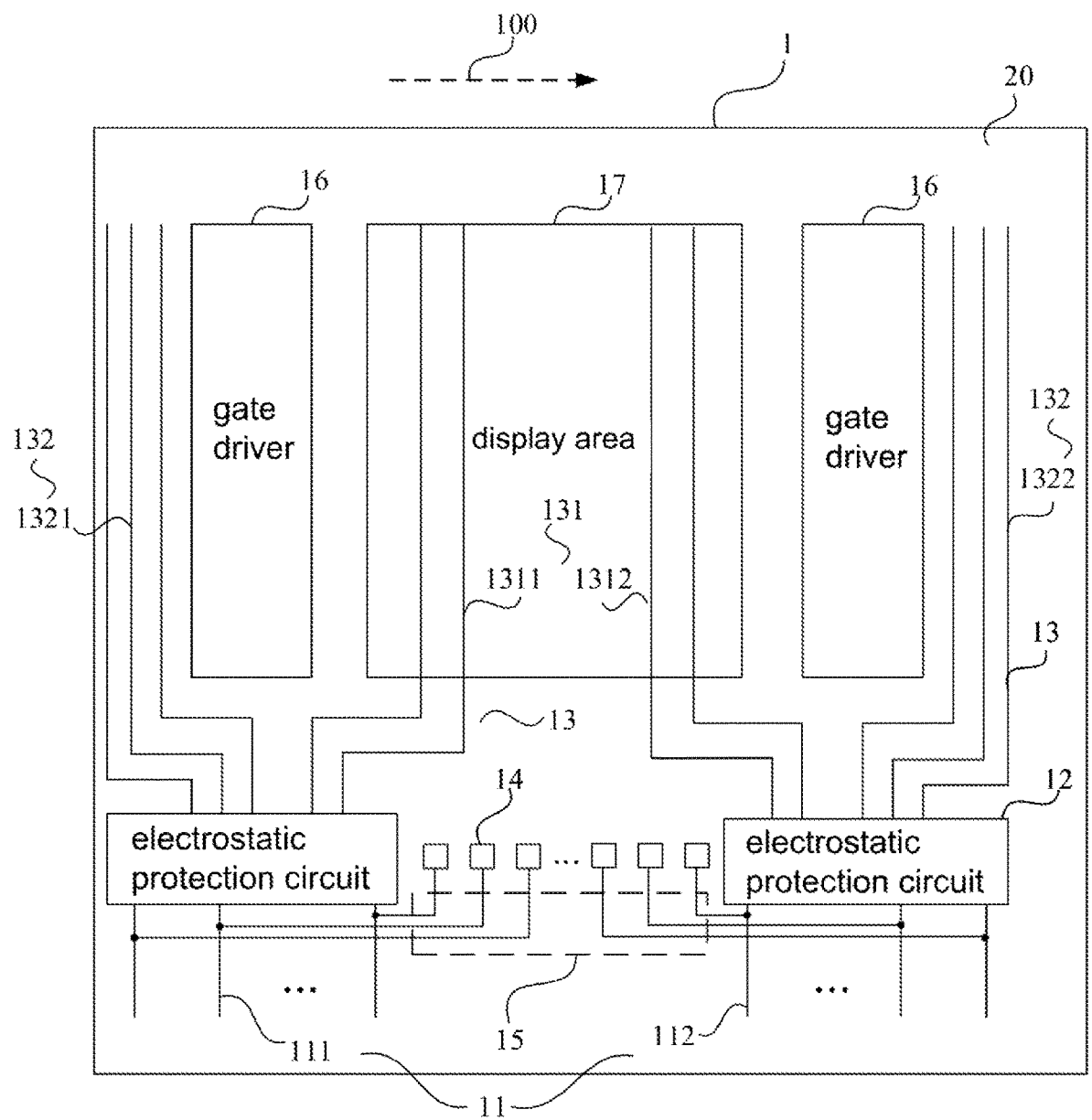
FIG. 2 is a schematic structure view showing an array substrate provided by this embodiment.

The present embodiment provides an array substrate. Referring to FIG. 2, which is a schematic structure view showing an array substrate provided by this embodiment. The array substrate 1 comprises a display area 17, a non-display area 20 (i.e. the portion of the array substrate 1 excluding the display area 17) surrounding the display area 17, a plurality of signal lines 13 disposed in the display area 17 and the non-display area 20, at least one electrostatic protection circuit 12 disposed in the non-display area 20, a plurality of test leads 11 correspondingly connected to the plurality of signal lines 13 respectively through the electrostatic protection circuit 12; and, a plurality of driving chip binding pads 14, which are correspondingly connected to the plurality of test leads 11 respectively through driving signal leads 15 and are configured to input a driving signal sent from a driving chip to the plurality of signal lines 13 through the plurality of test leads 11. The electrostatic protection circuit 12 comprises a first connection terminal electrically connected to the plurality of test leads 11, and a second connection terminal electrically connected to the plurality of signal lines 13, and the electrostatic protection circuit 12 is configured to output an electrostatic current generated by the array substrate 1 upon externally inputting a test signal and binding the drive chip.

In a production process of the display panel, when an array substrate 1 and a color filter substrate are bound to form the display panel, a panel lighting test needs to be performed to detect whether the display panel can be lighted up or not. If the display panel can not be lighted up, then the module process is no longer performed, and it is possible to prevent the module from being wasted. A plurality of test leads 11 are provided and respectively and correspondingly connected to the a plurality of signal lines 13 on the array substrate 1 through at least one electrostatic protection circuit 12 in order to input the test signal into the a plurality of signal lines 13 through the test leads 11 respectively corresponding to the signal lines 13, to light up the display panel, and to output the electrostatic charges generated by the test leads 11 through the electrostatic protection circuit 12.

In the module lighting test, the display panel is bound to the drive chip (not shown in the drawings), the drive chip is respectively and correspondingly connected to the a plurality of test leads 11 through the driving chip binding pads 14 shown in FIG. 2, and through multiple driving signal leads 15 respectively and correspondingly disposed and connected to the a plurality of driving chip binding pads 14. The driving chip binding pads 14 transport the inputted high voltage to the electrostatic protection circuit 12 through the a plurality of test leads 11 and can output the electrostatic charges, generated by the signal lines 13 and the devices connected to the signal lines 13, to the ground line when the drive chip is bound. In this embodiment, the driving chip binding pads 14, the driving signal leads 15, the test leads 11 and the signal lines 13 have the same number, and are respectively correspondingly and successively electrically connected together.

The first connection terminal of the electrostatic protection circuit 12 is electrically connected to the plurality of test leads 11, and the second connection terminal is electrically connected to the plurality of signal lines 13 and for outputting the electrostatic current generated by the entire array substrate upon externally inputting a test signal and binding a driving chip. Either the electrostatic charges introduced by the plurality of test leads 11 or the electrostatic charges introduced by the driving chip binding pads 14 can be outputted through the electrostatic protection circuit 12. Because the model of the electrostatic protection circuit required in the panel lighting test is larger than the electrostatic protection circuit required in the module lighting test, the model of the electrostatic protection circuit 12 applicable to the panel lighting test may be provided to function as the common electrostatic protection circuit of the panel lighting test and the module lighting test in this embodiment. As the model gets larger, the protection of the drive chip upon binding the driver chip gets better. In addition, when the drive chip subsequently drives the display panel, the entire array substrate may still be electrostatically protected by the electrostatic protection circuit 12.

Referring to FIG. 2, the test leads 11 and the driving chip binding pads 14 share at least one electrostatic protection circuit in this embodiment, the fan-out area of the space is greatly saved, and it is only necessary to dispose the driving signal leads 15 between the driving chip binding pads 14 and the test leads 11 in the fan-out area. Compared with FIG. 1c, a lot of the configured wires are decreased, and the process is simple.

The plurality of test leads of the array substrate provided by this embodiment are correspondingly connected to the plurality of signal lines through the electrostatic protection circuit, respectively, and the test signal is inputted to the plurality of signal lines. The plurality of driving chip binding pads are correspondingly connected to the plurality of test leads through the driving signal leads, respectively, and the drive signal sent from the drive chip is successively send to the plurality of signal lines through the multiple driving signal leads, the plurality of test leads and the electrostatic protection circuit. The first connection terminal of the electrostatic protection circuit is electrically connected to the plurality of test leads, and the second connection terminal is electrically connected to the plurality of signal lines and for outputting the electrostatic charges generated by the test leads, the driving chip binding pads, the signal lines and the connected devices upon externally inputting a test signal and binding a driving chip. In this embodiment, the display panel shares at least one electrostatic protection circuit in the panel lighting test and the module lighting test, and in the process that the subsequent drive chip drives the array substrate, the electrostatic protection circuit can be continuously used without having to individually dispose the electrostatic protection circuit of the panel lighting test and the electrostatic protection circuit of the module lighting test in the fan-out area of the display panel. Thus, the fan-out area of the space is saved, and the manufacturing process is simplified.

Figure 3:
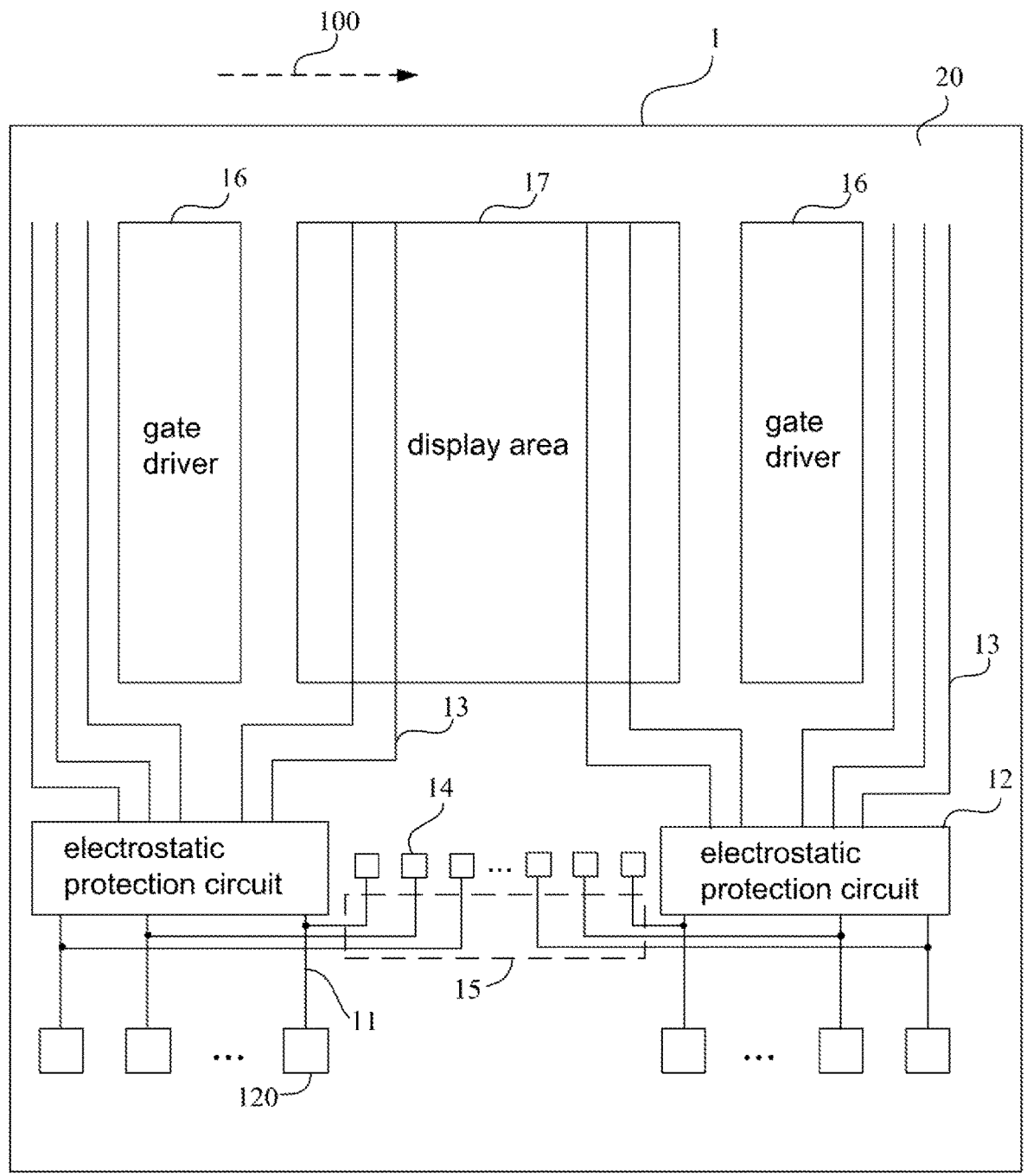
FIG. 3 is a schematic structure view showing another array substrate provided by this embodiment.

Optionally, referring to FIG. 3, which is a schematic structure view showing another array substrate provided by this embodiment, the array substrate 1 also includes the test pads 120, which are disposed in a non-display area 20 and respectively corresponding to and electrically connected to the plurality of test leads 11. In the production of the display panel, in order to perform the panel lighting test, the test binding pad 120 is further disposed on the array substrate 1, the test signal is inputted into the test binding pad 120 by the probe to light up the panel, and the model of the test binding pad 120 is much larger than that of the drive chip binding pad 14. For example, the dimension of the test binding pad 120 is 1,000 micrometers*500 micrometers, the dimension of the side length of the binding pad of the corresponding first electrostatic protection circuit 18 is about 2,000 micrometers, the dimension of the drive chip binding pad 14 is 150 micrometers*30 micrometers, the dimension of the side length of the binding pad of the corresponding second electrostatic protection circuit 19 is about 500 micrometers, and the above-mentioned dimension refers to the physical dimension. The test binding pad 120 is adapted to the provision of the probe, so the drive chip binding pad 14 can not be used in the panel lighting test to function as the test binding pad due to the mismatch between the drive chip binding pad 14 and the test probe. Therefore, the electrostatic protection circuit 12 in this embodiment is adapted to the test binding pad 120, and at the same time, the high voltage generated by the drive chip binding pad 14 can be better eliminated.

In addition, after the panel lighting test is finished, the test binding pad 120 will not be used again in the subsequent manufacturing process, and the test binding pad 120 may be cut away after the panel lighting test is finished to reduce the fan-out area and improve the screen display rate.

Figure 4:
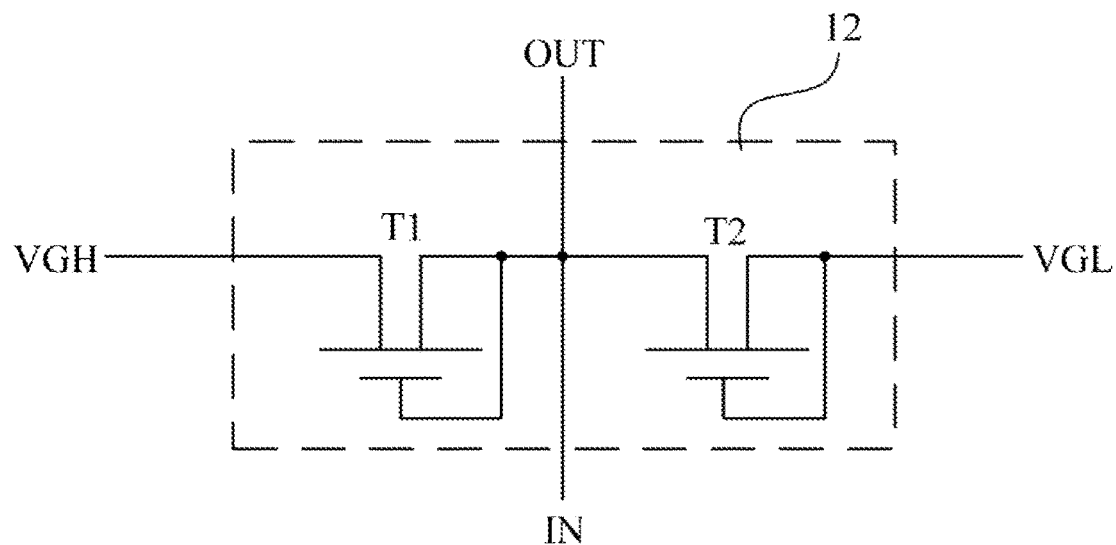
FIG. 4 is a schematic structure view showing an electrostatic discharge protection circuit provided by this embodiment.

The electrostatic charges are generated more easily at the location closer to the binding pad, so the electrostatic protection circuit is disposed near the binding pad. As shown in FIG. 3, the electrostatic protection circuit 12 is electrically connected to the test binding pad 120 directly through the test leads 11, and is electrically connected to the binding pads 14 through the driving signal leads 15 and for outputting the electrostatic charges generated by the test binding pad 120 and the binding pads 14. Optionally, please refer to FIG. 4, which is a schematic structure view showing an electrostatic discharge protection circuit provided by this embodiment. FIG. 4 is an example of at least one electrostatic protection circuit, and the electrostatic protection circuit mentioned in this embodiment includes the example shown in FIG. 4.

Optionally, the electrostatic protection circuit 12 includes two serially connected N-type thin film transistors T1 and T2, the source VGH terminal of T1 is connected to the power level terminal, the drain VGL of T2 is connected to the ground terminal, the connection terminal IN is electrically connected to the test leads 11 shown in FIG. 2 or FIG. 3, and the connection terminal OUT is electrically connected to the signal lines 13 shown in FIG. 2 or 3.

Figure 5:
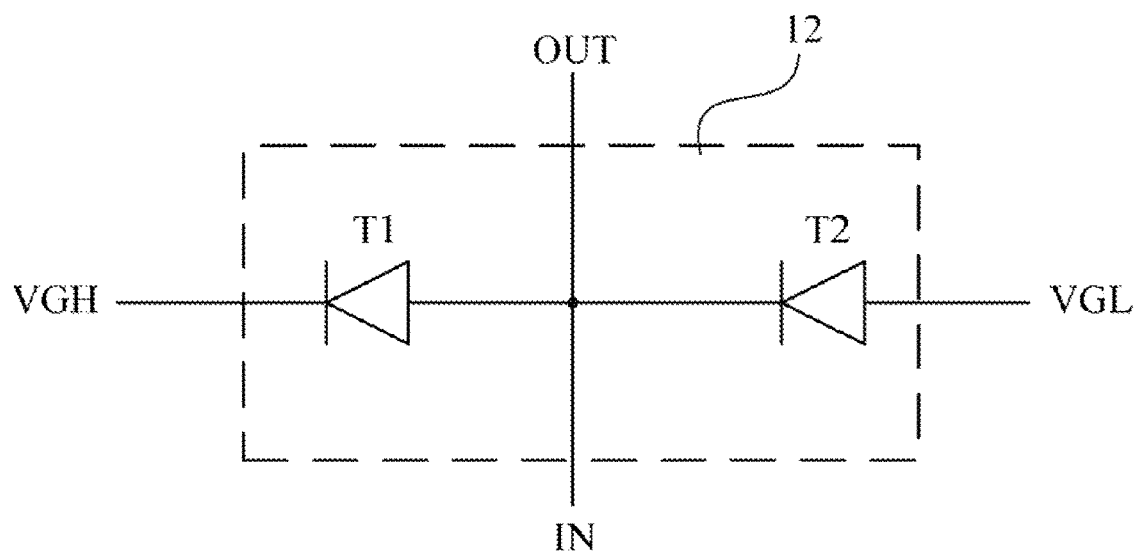
FIG. 5 is an equivalent schematic view showing the electrostatic discharge protection circuit shown in FIG. 4.

The gate and the drain of each thin film transistor are electrically connected to form a two-terminal thin film transistor. To a certain extent, the thin film transistor may be equivalent to a diode. As shown in FIG. 5, which is an equivalent schematic view showing the electrostatic discharge protection circuit shown in FIG. 4, when the voltage inputted from the test binding pad 120 or the binding pad 14 to the connection terminal IN is between the ground voltage and the power voltage, the current flows to the connection terminal OUT, and then to the signal line 13; when the voltage of the input connection terminal IN is higher than the power voltage, the current flows to the VGH terminal; and when the voltage of the input connection terminal IN is lower than the ground voltage, the current flows to the VGL terminal. It is worth noting that the voltage values of the test signal and the drive signal inputted from the connection terminal IN to the signal line 13 is between the ground voltage and the power voltage. Therefore, through the flow from the connection terminal OUT to the signal line 13, the electrostatic voltage is often much higher than the power supply voltage or much lower than the ground voltage, and the electrostatic currents may respectively flow to the power or the ground through the VGH terminal and the VGL terminal, so that the electrostatic protection circuit 12 performs the electrostatic discharge protection on the array substrate.

Referring to FIG. 2, the array substrate 1 includes a display area 17 and the non-display area 20, wherein gate drivers 16 are respectively disposed in the non-display area 20 on two sides of the display area 17 in a first direction 100; and the signal line 13 includes data signal lines 131 disposed in the display area 17 and drive signal lines 132 of the gate drivers 16 disposed in the non-display area 20, wherein the signal lines 13 are disposed in a second direction perpendicular to the first direction 100.

The array substrate 1 includes the display area 17 provided with the data signal lines 131 and gate drive lines, and includes the non-display area 20 surrounding the display area 17. The gate drivers 16 are respectively disposed on two sides of the display area 17 in the first direction 100, and the gate drivers 16 are used to generate gate drive signals, having the number the same as the number of gate drive lines, according to a trigger signal. The gate drive signals are used to control the switch of the thin film transistor in the display area 17. There are two gate drivers 16 respectively disposed on two sides of the display area 17 and for respectively providing the gate drive signals of the gate drive lines in odd-numbered rows and even-numbered rows to implement simplification of the circuit. Also, it is possible to provide the gate drive signals of all the gate drive lines respectively from two sides to prevent the gate drive signals from attenuating in the transmission process. Of course, the gate drivers 16 may also be disposed only on one side of the display area 17.

The signal lines 13 includes the data signal lines 131 in the display area 17 and the drive signal lines 132 of the gate drivers 16 in the non-display area 20. All of the data signal lines 131 and the drive signal lines 132 are disposed in the second direction perpendicular to the first direction 100.

Optionally, the drive signal lines 132 of the gate drivers 16 include power lines, clock signal lines and trigger signal lines for respectively providing power signals, clock signals and trigger signals for the gate drivers 16.

Optionally, referring to FIG. 2, the a plurality of test leads 11 and the driving chip binding pads 14 are disposed in the non-display area 20 on one side of the display area in the second direction. As an example, if the display panel is a mobile phone screen display panel, then the a plurality of test leads 11 and the driving chip binding pads 14 are disposed in the non-display area 20 above the mobile phone display (one side on which the handset is provided) or below the mobile phone display (one side on which the operation keys are provided), and the drive signal lines 132 are disposed in the non-display area 20 on the left and right sides of the mobile phone display. The above-mentioned location setting can reduce the area of the non-display area 20 on both the left and right sides of the mobile phone display so as to make the whole mobile phone become more beautiful.

Optionally, referring to FIG. 2, the a plurality of test leads 11 are divided into a first portion of test leads 111 and a second portion of test leads 112; the data signal lines 131 include a first portion of data signal lines 1311 and a second portion of data signal lines 1312; and the drive signal lines 132 include a first portion of drive signal lines 1321 and a second portion of drive signal lines 1322.

The first portion of test leads 111 are respectively corresponding to and electrically connected to the first portion of data signal lines 1311 and the first portion of drive signal lines 1321; and the second portion of test leads 112 are respectively corresponding to and electrically connected to the second portion of data signal lines 1312 and the second portion of drive signal lines 1322.

When the display resolution gets higher, a large number of data signal lines 131 are provided. As shown in FIG. 2, the data signal lines 131 may be divided into two portions for wiring, and correspondingly, the plurality of test leads 11 may also be divided into two portions to reduce the space density of the test leads 11. Referring to FIG. 2, the plurality of test leads 11 are divided into the first portion of test leads 111 and the second portion of test leads 112. Because the gate drivers 16 are respectively disposed on two sides of the display area 17 in the first direction 100, the drive signal lines 132 of the gate drivers 16 on one side and a portion of the data signal lines 131 in the display area 17 function as the first portion of data signal lines 1311 and the first portion of drive signal lines 1321, and the drive signal lines 132 of the gate drivers 16 on the other side and the remaining portion of the data signal lines 131 in the display area 17 function as the second portion of data signal lines 1312 and the second portion of drive signal lines 1322.

Optionally, the side on which the first portion of test leads are located is the same as the side on which the first portion of data signal lines and the drive signal lines are located. The side on which the second portion of test leads are located is the same as the side on which the second portion of data signal lines and the drive signal lines are located. The symmetrical setting reduces the wiring length and simplifies the manufacturing process.

Optionally, referring to FIG. 2 or FIG. 3, the driving chip binding pads 14 are located between the first portion of test leads and the second portion of test leads, and it is easy to shorten the wiring length and bind the drive chip.

Optionally, the number of the first portion of test leads is the same as the number of the second portion of test leads; and the number of the first portion of data signal lines and the drive signal lines is the same as the number of the second portion of data signal lines and the drive signal lines. The first portion of test leads and the second portion of test leads may be symmetrically disposed to facilitate the wiring and simplify the process.

This embodiment further provides an array substrate. Referring to FIG. 2 or 3, the array substrate 1 includes the display area 17 and the non-display area 20 surrounding the display area 17 (the portion of the array substrate 1 other than the display area 17), and includes: a plurality of signal lines 13 disposed in the display area 17 and the non-display area 20; and the electrostatic protection circuit 12 disposed in the non-display area 20; a plurality of test leads 11 correspondingly connected to the a plurality of signal lines 13 respectively through the electrostatic protection circuit 12; a plurality of driving chip binding pads 14 correspondingly connected to the a plurality of test leads 11 respectively through driving signal leads 15 and for inputting a driving signal sent from a driving chip to the a plurality of signal lines 13 through the a plurality of test leads 11; the electrostatic protection circuit 12, wherein the electrostatic protection circuit 12 has the first connection terminal electrically connected to the a plurality of test leads 11, and the second connection terminal electrically connected to the a plurality of signal lines 13, and is for outputting the electrostatic current generated by the entire array substrate 1 upon externally inputting a test signal and binding a driving chip; the gate drivers 16 respectively disposed in the non-display area 20 on two sides of the display area 17 in the first direction; the signal lines 13 including the data signal lines 131 disposed in the display area 17 and the drive signal lines 132 of the gate drivers 16 disposed in the non-display area 20, wherein the signal lines 13 are disposed in the second direction perpendicular to the first direction; and the test binding pad 120 (see FIG. 3) respectively corresponding to and electrically connected to the a plurality of test leads 11.

Figure 6:
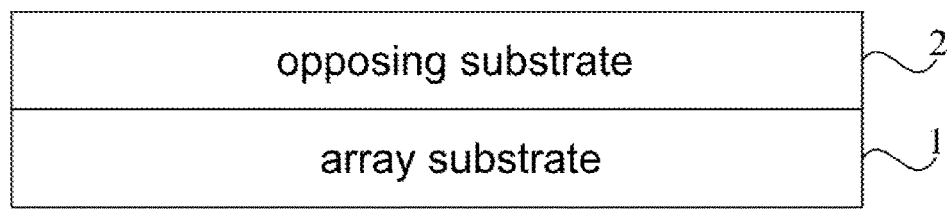
FIG. 6 is a cross-sectional structure view showing a display panel provided by this embodiment.

This embodiment further provides a display panel. Referring to FIG. 6, which is a cross-sectional structure view showing a display panel provided by this embodiment, the display panel includes an opposing substrate 2 and the array substrate 1 described in any embodiment. The display panel may be applied to display apparatuses such as a mobile phone, a television and so on.

In some embodiments, the display panel can be a LCD panel, OLED display panel, QLED display panel, curved display panel, or other display panel.

INDUSTRIAL UTILITY

The display panel provided by this disclosure shares at least one electrostatic protection circuit in the panel lighting test and the module lighting test, and it is not necessary to individually dispose the electrostatic protection circuit for the panel lighting test and the electrostatic protection circuit for the module lighting test in the fan-out area of the display panel. Hence, the fan-out area of the space is saved, and the manufacturing process is simplified.

What is claimed is:

1. An array substrate, comprising:
   a display area;
   a non-display area surrounding the display area;
   a plurality of signal lines disposed in the display area and the non-display area;
   at least one electrostatic protection circuit disposed in the non-display area;
   a plurality of test leads disposed in the non-display area and correspondingly connected to the plurality of signal lines respectively through the electrostatic protection circuit; and
   a plurality of driving chip binding pads, which are disposed in the non-display area, correspondingly connected to the plurality of test leads respectively through driving signal leads, and are configured to input a driving signal sent from a driving chip to the plurality of signal lines through the plurality of test leads;
   wherein the electrostatic protection circuit comprises a first connection terminal electrically connected to the plurality of test leads, and a second connection terminal electrically connected to the plurality of signal lines, and the electrostatic protection circuit is configured to output an electrostatic current generated by the array substrate upon externally inputting a test signal and binding the drive chip.

2. The array substrate according to claim 1, further comprising:
   a plurality of test pads disposed in the non-display area, and respectively corresponding to and electrically connected to the plurality of test leads.

3. The array substrate according to claim 1, wherein, in a first direction, at least two gate drivers are disposed in the non-display area which is on two sides of the display area;
   the signal lines comprise data signal lines which are disposed in the display area and drive signal lines of the gate drivers in the non-display area, the signal lines are disposed in a second direction and the second direction is perpendicular to the first direction.

4. The array substrate according to claim 3, wherein:
   the plurality of test leads and the driving chip binding pads are disposed in the non-display area on one side of the display area in the second direction.

5. The array substrate according to claim 4, wherein:
   the plurality of test leads comprise a first portion of test leads and a second portion of test leads;
   the data signal lines comprise a first portion of data signal lines and a second portion of data signal lines;
   the drive signal lines comprise a first portion of drive signal lines and a second portion of drive signal lines; and
   the first portion of test leads are respectively corresponding to and are electrically connected to the first portion of data signal lines and the first portion of drive signal lines, and the second portion of test leads are respectively corresponding to and are electrically connected to the second portion of data signal lines and the second portion of drive signal lines.

6. The array substrate according to claim 5, wherein:
   the first portion of test leads and the second portion of test leads are respectively disposed on two sides of the driving chip binding pads.

7. The array substrate according to claim 5, wherein:
   the number of the first portion of test leads and the number of the second portion of test leads are the same; and
   the number of the first portion of data signal lines and the first portion of drive signal lines is the same as the number of the second portion of data signal lines and the second portion of drive signal lines.

8. The array substrate according to claim 3, wherein the drive signal lines of the gate drivers comprise:
   power lines, clock signal lines and trigger signal lines.

9. An array substrate, comprising:
   a display area;
   a non-display area surrounding the display area;
   a plurality of signal lines disposed in the display area and the non-display area;
   at least one electrostatic protection circuit disposed in the non-display area;
   a plurality of test leads disposed in the non-display area and correspondingly connected to the plurality of signal lines respectively through the electrostatic protection circuit;
   a plurality of driving chip binding pads, which are disposed in the non-display area, correspondingly connected to the plurality of test leads respectively through driving signal leads, and are configured to input a driving signal sent from a driving chip to the plurality of signal lines through the plurality of test leads; and
   a plurality of test pads,
   wherein the electrostatic protection circuit comprises a first connection terminal electrically connected to the plurality of test leads, and a second connection terminal electrically connected to the plurality of signal lines, and the electrostatic protection circuit is configured to output an electrostatic current generated by the array substrate upon externally inputting a test signal and binding the drive chip,
   in a first direction, at least two gate drivers are disposed in the non-display area which is on two sides of the display area;
   the signal lines comprise data signal lines which are disposed in the display area and drive signal lines of the gate drivers in the non-display area, the signal lines are disposed in a second direction and the second direction is perpendicular to the first direction, and
   the test pads are respectively corresponding to and electrically connected to the plurality of test leads.

10. A display panel, comprising an opposing substrate and an array substrate, wherein:
the array substrate comprises:
a display area;
a non-display area surrounding the display area;
a plurality of signal lines disposed in the display area and the non-display area;
at least one electrostatic protection circuit disposed in the non-display area;
a plurality of test leads disposed in the non-display area and correspondingly connected to the plurality of signal lines respectively through the electrostatic protection circuit; and
a plurality of driving chip binding pads, which are disposed in the non-display area, correspondingly connected to the plurality of test leads respectively through driving signal leads, and are configured to input a driving signal sent from a driving chip to the plurality of signal lines through the plurality of test leads;
wherein the electrostatic protection circuit comprises a first connection terminal electrically connected to the plurality of test leads, and a second connection terminal electrically connected to the plurality of signal lines, wherein the electrostatic protection circuit is configured to output an electrostatic current generated by the array substrate upon externally inputting a test signal and binding the drive chip.

11. The display panel according to claim 10, wherein the array substrate further comprises:
a plurality of test pads disposed in the non-display area, and respectively corresponding to and electrically connected to the plurality of test leads.

12. The display panel according to claim 10, wherein the array substrate further comprises:
at least two gate drivers disposed in the non-display area on two sides of the display area in a first direction;
wherein the signal lines comprise data signal lines disposed in the display area and drive signal lines of the gate drivers disposed in the non-display area, wherein the signal lines are disposed in a second direction perpendicular to the first direction.

13. The display panel according to claim 12, wherein:
the plurality of test leads and the driving chip binding pads are disposed in the non-display area on one side of the display area in the second direction.

14. The display panel according to claim 13, wherein:
the plurality of test leads comprise a first portion of test leads and a second portion of test leads;
the data signal lines comprise a first portion of data signal lines and a second portion of data signal lines;
the drive signal lines comprise a first portion of drive signal lines and a second portion of drive signal lines; and
the first portion of test leads are respectively corresponding to and are electrically connected to the first portion of data signal lines and the first portion of drive signal lines; and the second portion of test leads are respectively corresponding to and are electrically connected to the second portion of data signal lines and the second portion of drive signal lines.

15. The display panel according to claim 14, wherein:
the first portion of test leads and the second portion of test leads are respectively disposed on two sides of the driving chip binding pads.

16. The display panel according to claim 14, wherein:
the number of the first portion of test leads and the number of the second portion of test leads are the same; and
the number of the first portion of data signal lines and the first portion of drive signal lines is the same as the number of the second portion of data signal lines and the second portion of drive signal lines.

17. The display panel according to claim 12, wherein the drive signal lines of the gate drivers comprise:
power lines, clock signal lines and trigger signal lines.

18. The display panel according to claim 10, wherein the array substrate further comprises:
a gate driver disposed in the non-display area on one side of the display area;
wherein the signal lines comprise data signal lines disposed in the display area and drive signal lines of the gate drivers disposed in the non-display area, wherein the signal lines are disposed in a second direction perpendicular to the first direction.

* * * * *